(12) United States Patent
Mazzucchelli

(10) Patent No.: US 11,049,549 B2
(45) Date of Patent: Jun. 29, 2021

(54) DECODER STRUCTURE INCLUDING ARRAY OF DECODER CELLS ORGANIZED INTO DIFFERENT ROWS

(71) Applicant: SK hynix Inc., Icheon-si (KR)

(72) Inventor: Simone Mazzucchelli, Agrate Brianza (IT)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/786,814

(22) Filed: Feb. 10, 2020

(65) Prior Publication Data

US 2020/0258564 A1    Aug. 13, 2020

(30) Foreign Application Priority Data

Feb. 11, 2019  (IT) .................... 102019000001947

(51) Int. Cl.
| | |
|---|---|
| *G11C 8/10* | (2006.01) |
| *G11C 11/408* | (2006.01) |
| *G11C 5/02* | (2006.01) |
| *G11C 11/4074* | (2006.01) |
| *G11C 11/409* | (2006.01) |
| *G11C 7/00* | (2006.01) |

(52) U.S. Cl.
CPC .......... *G11C 11/4087* (2013.01); *G11C 5/025* (2013.01); *G11C 11/409* (2013.01); *G11C 11/4074* (2013.01); *G11C 11/4085* (2013.01); *G11C 7/00* (2013.01)

(58) Field of Classification Search
CPC ....... G11C 17/00; G11C 11/005; G11C 5/025; G11C 14/00; G11C 7/00; G11C 8/10; G11C 11/418; G11C 16/08; G11C 11/4087; G11C 11/4063; G11C 11/41
See application file for complete search history.

(56) References Cited

U.S. PATENT DOCUMENTS

| | | | |
|---|---|---|---|
| 5,854,772 A | 12/1998 | Suzu | |
| 10,468,093 B2 * | 11/2019 | Chatterjee | ........... G11C 11/4087 |
| 2001/0014042 A1 * | 8/2001 | Kato | ........... G11C 8/12 365/200 |
| 2002/0024871 A1 | 2/2002 | Cho | |
| 2004/0223369 A1 | 11/2004 | Choi et al. | |
| 2005/0057970 A1 * | 3/2005 | Ogura | ........... G11C 16/12 365/185.23 |
| 2014/0334238 A1 * | 11/2014 | Ware | ........... G11C 7/1039 365/189.14 |
| 2016/0172028 A1 | 6/2016 | Park et al. | |
| 2017/0278582 A1 * | 9/2017 | Sun | ........... G11C 7/067 |
| 2018/0144799 A1 | 5/2018 | Yi et al. | |

FOREIGN PATENT DOCUMENTS

| | | |
|---|---|---|
| KR | 1020010036710 A | 5/2001 |
| KR | 1020050005575 A | 1/2005 |

\* cited by examiner

*Primary Examiner* — Mushfique Siddique
(74) *Attorney, Agent, or Firm* — William Park & Associates Ltd.

(57) ABSTRACT

A decoder structure for selecting a column of memory cells in a memory architecture includes an array of decoder cells organized into different rows. Each row includes a plurality of sub-column groups of decoder cells configured to receive a same input signal. Each sub-column group of decoder cells of a row is coupled to a sub-column group of decoder cells of a subsequent row. The decoder structure further includes a plurality of precharge transistors connected to the decoder cells of a row so as to form a plurality of inverter blocks.

11 Claims, 4 Drawing Sheets

DECODER STRUCTURE INCLUDING ARRAY OF DECODER CELLS ORGANIZED INTO DIFFERENT ROWS

CROSS-REFERENCE TO RELATED APPLICATION

The present application claims priority under 35 U.S.C. § 119(a) to Italian patent application number 102019000001947 filed on Feb. 11, 2019, in the Italian Intellectual Property Office, the entire disclosure of which is incorporated herein by reference.

BACKGROUND

1. Technical Field

The present disclosure relates to a decoder structure for a memory architecture.

2. Related Art

Generally, a storage device is a device which stores data under the control of a host device, such as a computer, a smartphone, or a smartpad. According to the type of device provided to store data, examples of the storage device may be classified as a device such as a hard disk drive (HDD) which stores data in a magnetic disk, and a device such as a solid-state drive (SSD) or a memory card which stores data in a semiconductor memory, particularly, a nonvolatile memory.

The storage device may include a memory device to which data is stored, and a memory controller configured to store data to the memory device. The memory device may be classified as a volatile memory device or a nonvolatile memory device. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

As used herein, the term "memory device" may be interchangeable with the term "memory architecture."

As is well known, nowadays memory devices are more and more important and necessary parts of many electronic systems. In order to make an electronic system more compact and faster, optimization of the memory architecture therein in terms of area, power, and speed is sought.

Memory architecture essentially includes individual memory cells arranged in an array of horizontal rows and vertical columns, each memory cell being usually able to store 1-bit of binary information. Considering an array including M rows of memory cells, also called word lines, and N columns of memory cells, also called bit lines, the total number of memory cells is M×N.

To access a particular memory cell, i.e., a particular data bit in this array, the corresponding word line and corresponding bit line should be activated (or selected) according to the address coming from the outside of the memory architecture. The row and column selection operations are accomplished by row and column decoders, respectively, still included in the memory architecture. The row and column decoders select a memory cell to read or to modify its contents. To be more specific, the row and column decoders select at least one memory cell on which to perform a read operation, an erase operation, or a program operation. Namely, a row decoder circuit selects at least one out of M word lines according to a row address, while the column decoder circuit selects at least one out of N bit-lines according to a column address.

The performance of the row and column decoders influences the memory speed as a whole, being sensitive data especially in high performance memory devices, such as the SRAMs.

More particularly, a column decoder circuit usually includes a plurality of NMOS transistors coupled to N bit lines, respectively, so as to select a predetermined column or bit line in response to a column selection signal applied to the control terminals of these transistors.

Memory architectures are known from US Patent Applications No. US 2002/0024871 and No. US 2004/0223369: These known memory architectures include respective column decoders allowing a column be selected by decoding in steps, the plurality of NMOS transistors included therein being organized according to a plurality of sub-column groups and the column decoders further including a predecoding circuit which decodes a column address, any single line being activated in response to a block select signal. In this way, the predecoding circuit decodes output signals (column address) for selecting one sub-column group and one column is selected from the selected sub-column group in response to a block decoding signal being a control signal.

SUMMARY

In an embodiment of the present teachings, a decoder structure for selecting a column of memory cells in a memory architecture includes an array of decoder cells arranged into different rows. Each row includes a plurality of sub-column groups of decoder cells configured to receive a same input signal, and each sub-column group of decoder cells of a row is coupled to a sub-column group of decoder cells of a subsequent row. The decoder structure also includes a plurality of precharge transistors connected to the decoder cells of a row so as to form a plurality of inverter blocks.

According to another embodiment of the present teachings, a decoder architecture including a plurality of decoder structures, with each decoder structure including a sub array of decoder cells organized into different rows. Each row including a plurality of sub-column groups of decoder cells configured to receive a same input signal, each sub-column group of decoder cells of a row is coupled to a sub-column group of decoder cells of a subsequent row, wherein each decoder structure further includes a plurality of precharge transistors connected to the decoder cells of a row so as to form a plurality of inverter blocks.

BRIEF DESCRIPTION OF THE DRAWINGS

The characteristics and advantages of this disclosure will be apparent from the following description of embodiments given by way of indicative and non-limiting example with reference to the annexed drawings.

DETAILED DESCRIPTION

Figure 1A:
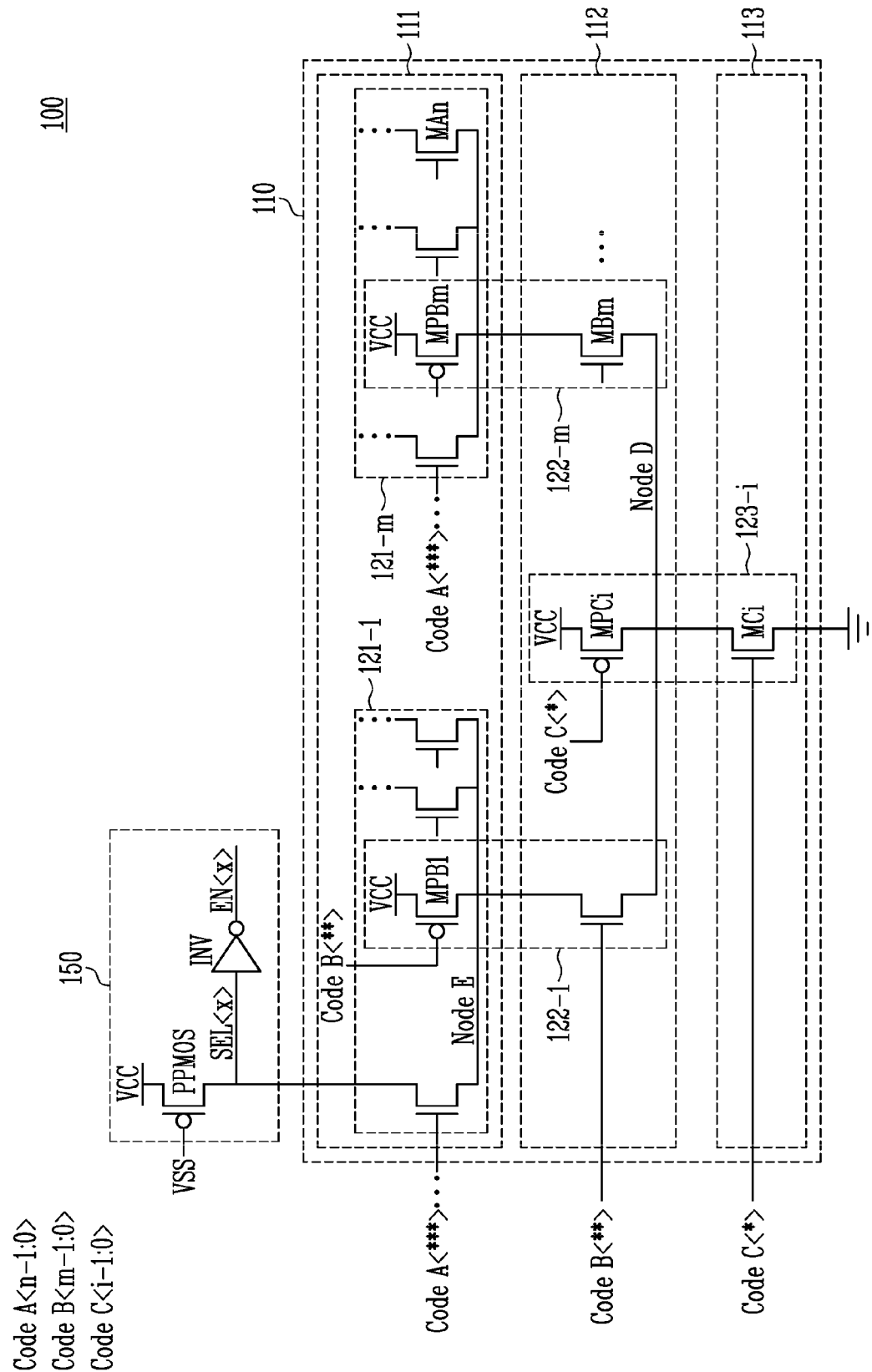
FIGS. 1A, 1B, and 1C show a decoder structure for a memory architecture, according to an embodiment of the present disclosure, and two working conditions thereof, respectively.

Embodiments of the present teachings will be described in detail below with reference to the accompanying drawings.

While the present teachings shown and described in connection with embodiments thereof, it will be apparent to those skilled in the art that various modifications can be made without departing from the spirit and scope of the present teachings. The terms and words used in the specification and claims should not be construed as their ordinary or dictionary sense. On the basis of the principle that the inventor can define the appropriate concept of a term in order to describe his/her own teachings in the best way, it should be construed as a meaning and concepts for complying with the technical idea of the present teachings. In addition, detailed descriptions of constructions being well known in the art may be omitted to avoid unnecessarily obscuring the clarity of the present teachings.

In the drawings, corresponding features are identified by the same reference numerals.

Embodiments of the present teachings are directed to an improved decoder structure. The aim of the proposed decoder structure is to reduce unwanted drop in the selection signal and to avoid a spurious enabling signal, as well as to reduce the total area occupied by the decoder structure in memory architecture and the power consumption thereof.

FIG. 1A schematically shows a decoder structure according to an embodiment, globally indicated as 100, namely a column decoder for memory architecture, not shown in the figure.

The decoder structure 100 includes at least an array 110 of decoder cells, being organized into different rows or decoding levels. For some embodiments, the decoder cells are NMOS transistors. More particularly, the array 110 includes at least a first row 111 including a plurality of first level NMOS transistors or first level decoder cells MAn, a second row 112 including a plurality of second level NMOS transistors or second level decoder cells MBm, and a third row 113 including a plurality of third level NMOS transistors or third level decoder cells MCi. The decoder cells of a same row or level have control terminals receiving respective first level input signal Code A<n−1, 0>, second level input signal Code B<m−1, 0>, and third level input signal Code C<i−1, 0>, independently applied to a row of the array 110.

The first row 111 further includes a plurality of first sub-column groups 121-$m$ of the first level decoder cells MAn, the decoder cells of each first sub-column group having a control terminal receiving a same first level input signal Code A and being connected in series with a second level decoder cell MBm of the second row 112, the number m of the first sub-column groups 121-$m$ of first level decoder cells MAn of the first row 111 being equal to the number of second level decoder cells MBm of the second row 112. In the example illustrated by FIG. 1A, the first row 111 includes two first sub-column groups 121-1 and 121-$m$, each including three first level decoding cells MAn having control terminals receiving respective first level input signal Code A<*>, being * equal to 0, 1, ... n−1.

Moreover, the second level decoder cells MBm of the second row 112, having control terminals receiving a same second level input signal Code B<>, being  equal to 0, 1, ... m−1, form one second sub-column group which is connected in series to a third level decoder cell MCi of the third row 113. The third level decoder cell MCi of the third row 113, in turn, has a control terminal receiving a third level input signal Code C<*>, being * equal to 0, 1, ... i−1 and being connected to ground GND. The third level decoder cell MCi is a single global column group connected to a block of the memory architecture, as will be explained in the following.

In this way, at least three input signal Code A, Code B, and Code C are independently applied to respective rows of n decoder cells, m decoder cells, and i decoder cells of the array 110. A plurality of decoder cells of a row included in a decoder sub-column group are commonly coupled to a single decoder cell included in a subsequent row.

In other words, the decoder structure 100 includes an array 110 wherein n NMOS transistors coupled to n bit lines are grouped into m first sub-column groups, which are coupled to i second sub-column groups, which, in turn, are coupled to a single global column group. In other words, in the array 110, a plurality of NMOS transistors of a row are connected to a single NMOS transistor of a subsequent row, so providing decoding by different levels and reducing the total number of the NMOS transistors included the decoder structure 100.

Hence, the total number of NMOS transistors MAn, MBm, and MCi of the array 110 is reduced as compared to the known solutions and, consequently, the power consumption of the decoder structure 100 as a whole may be reduced.

The decoder structure 100 further includes a precharge circuit 150 including an inverting gate INV which provides an enabling signal EN<x> which is set equal to 1 when the first level input signal Code A<n−1, 0>, the second level input signal Code B<m−1, 0>, and the third level input signal Code C<i−1:0> are HIGH (i.e. have a value equal to a high voltage value VCC) so as to simultaneously switch on the corresponding first level decoder cells MAn, second level decoder cells MBm, and third level decoder cells MCi. In this way, a first internal node D and a second internal node E are connected to a power supply reference voltage VSS. The precharge circuit 150 further includes a PMOS precharge transistor PPMOS inserted between a high voltage reference VCC and the array 110 with a control terminal receiving the power supply reference voltage VSS. The PMOS precharge transistor PPMOS is also connected to the input of the inverting gate INV and provides a selection signal SEL<x> to the inverting gate INV.

Suitably, the decoder structure 100 further includes a plurality of second level PMOS precharge transistors MPBm connected to the high voltage reference VCC and to each second level decoder cell MBm corresponding to the second internal node E to form a plurality of second level inverter blocks 122-$m$.

Moreover, the decoder structure 100 includes a plurality of third level PMOS precharge transistors MPCi connected to the high voltage reference VCC and to each third level decoder cell MCi corresponding to the first internal node D to form a plurality of third level inverter blocks 123-$i$.

In the example illustrated by FIG. 1A, the decoder structure 100 includes two second level inverter blocks, 122-1 and 122-$m$, and a single third level inverter block 123-$i$.

In particular, the plurality of second level and third level PMOS precharge transistors are thus able to reduce unwanted drop in the selection signal SEL<x> and to avoid a spurious enabling signal EN<x> by forcing the first internal node D and the second internal node E out from a floating condition when the decoding condition changes, as will be explained herein below.

Considering an initial decoding condition wherein the decoding code has the first level input signal Code A<0>=HIGH, the second level input signal Code B<0>=HIGH, and the third level input signal Code C<0>=HIGH, corresponding to the enabling signal EN<0>=VCC and the selection signal SEL<0>=VSS, the first internal node D as well as a second internal node E are discharged to the power supply reference voltage VSS.

It should be noted that in prior art decoder structures, in the absence of the PMOS precharge transistors, the first internal node D and the second internal node E are floating and stay at the power supply reference voltage VSS, these nodes can have high capacitances.

Suitably, the plurality of second level and third level PMOS precharge transistors are able to bring back the nodes D and E to the high voltage reference VCC.

Figure 1B:
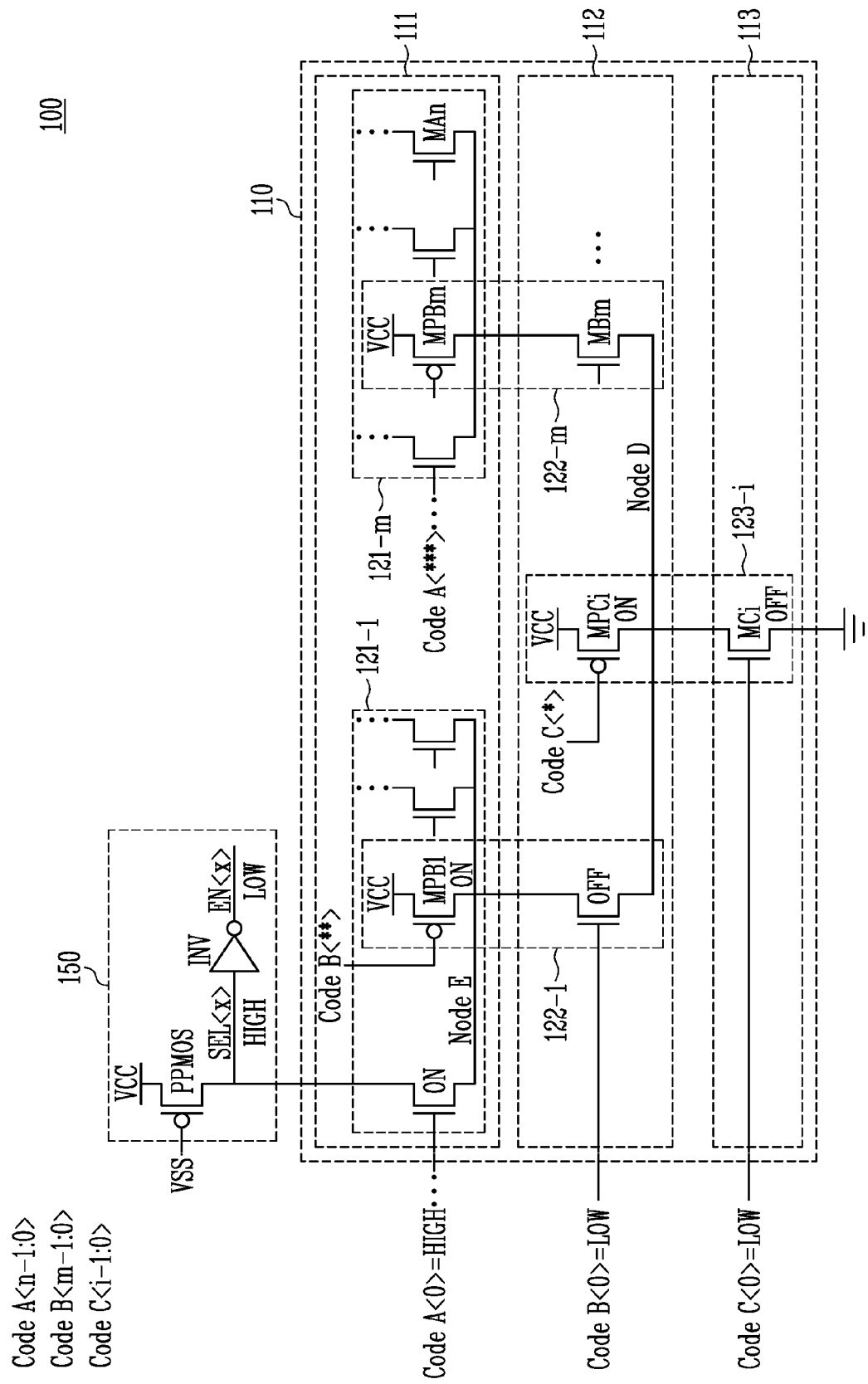

In particular, as shown in FIG. 1B, starting from the above indicated decoding condition, and considering a further decoding code that has the first level input signal Code A<0>=LOW, the second level input signal Code B<0>=LOW, and the third level input signal Code C<0>=LOW, corresponding to all enabling signals EN inside a sub block equal to LOW and all selection signals SEL equal to HIGH, the first level decoder cells MAn are turned on while the second level decoder cells MBm are turned off. Thus if the second internal node E has a low level due to some previous decoding charge sharing between such a second internal node E and the selection signal SEL<x>, and if the PMOS precharge transistor PPMOS inside the precharge circuit 150 does not have enough driver capability, then there is a drop in the selection signal SEL<x> and an unwanted enabling signal EN<x>=HIGH. However, due to presence of the second level PMOS precharge transistors MPBm being turned on, the first internal node D and the second internal node E are brought back to the high voltage reference VCC and charge sharing is thus suitably avoided.

Figure 1C:
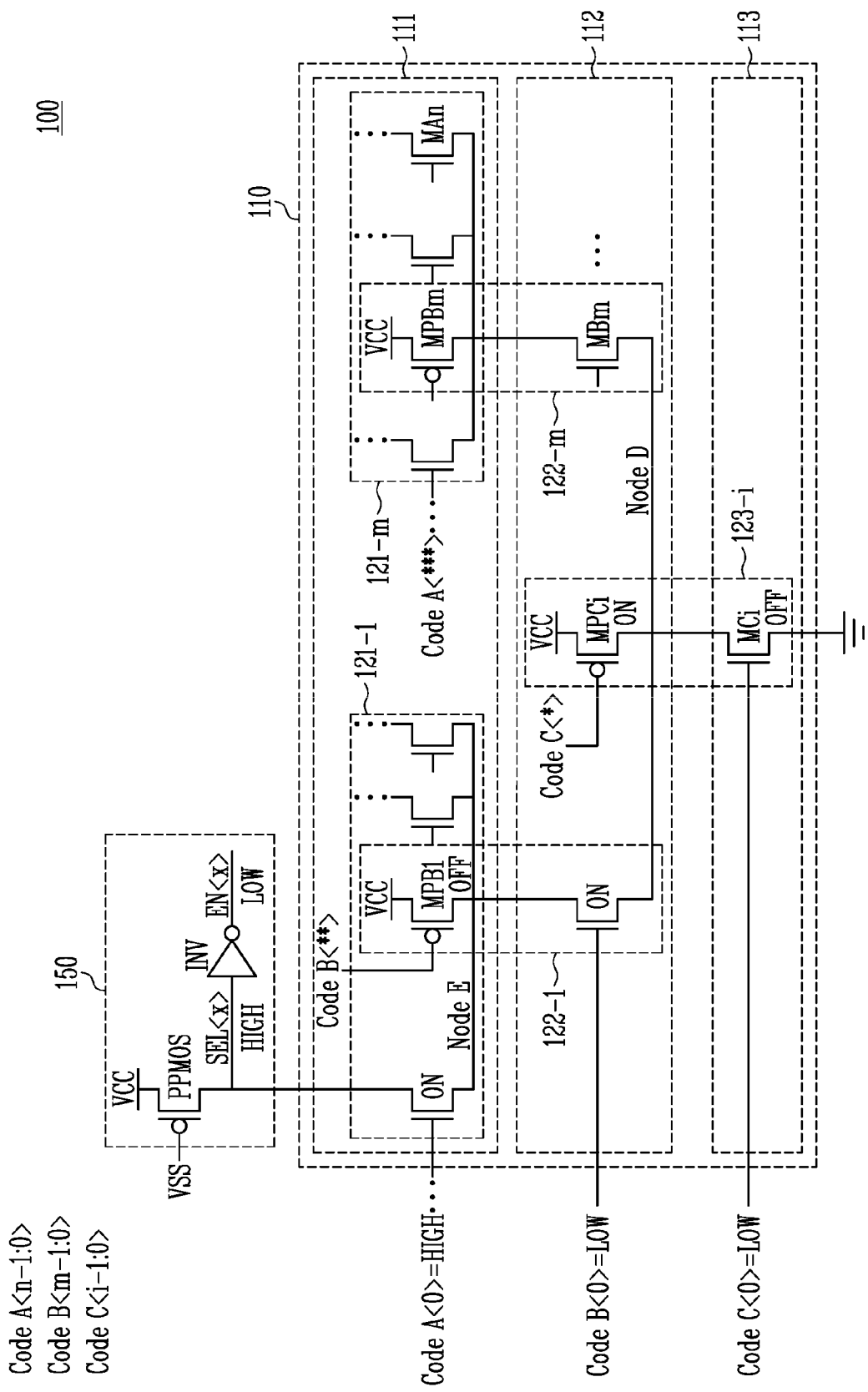

Moreover, as shown in FIG. 1C, considering an even further decoding code that has the first level input signal Code A<0>=HIGH, the second level input signal Code B<0>=LOW, and the third level input signal Code C<1>=HIGH, being thus the third level input signal Code C<0>=LOW, corresponding to all enabling signals EN inside a sub block equal to LOW and all selection signals SEL equal to HIGH, the first level decoder cells MAn and the second level decoder cells MBm are turned on, while the third level decoder cell MCi is turned off. Due to presence of the second level PMOS precharge transistors MPBm as well of the third level PMOS precharge transistor MPCi being turned on, the first internal node D and the second internal node E are now charged to the high voltage reference VCC and thus there is no charge sharing and unwanted pulse of the enabling signal EN<0>.

Figure 2:
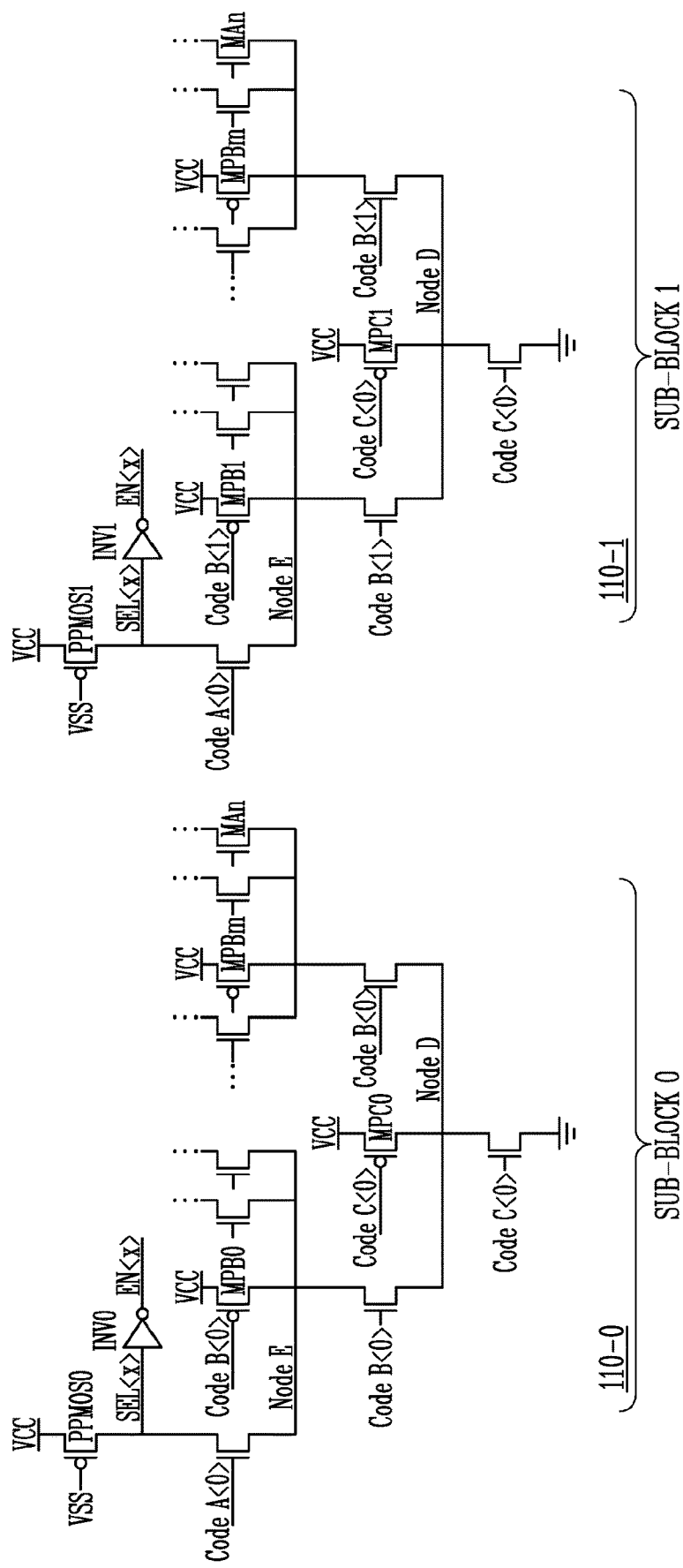
FIG. 2 shows a decoder structure for a memory architecture according to an embodiment of the present disclosure.

More particularly, for some embodiments, the decoder structure 100 shown in FIG. 1A is actually repeated in a plurality of sub blocks i, each sub block including a sub array 110-i of the array 110 and a third level decoder cell MCi. For example, decoder architecture of FIG. 2 includes a first sub block 0 having the decoding structure above described and including a first sub array 110-0 and a second sub block 1 having the decoding structure above described and including a first sub array 110-1. The first sub array 110-0 includes a first plurality of first level decoder cells MA0n, a first plurality of second level decoder cells MB0m and a first third level decoder cell MC0, as well as a first precharge circuit 150-0 including a first PMOS precharge transistor PPMOS0 and a first inverting gate INV0. Similarly, the second sub block 1 includes a second sub array 110-0 in turn including a second plurality of first level decoder cells MA1n, a second plurality of second level decoder cells MB1m and a second third level decoder cell MC1, as well as a second precharge circuit 150-1 including a second PMOS precharge transistor PPMOS1 and a second inverting gate INV1. As previously, the decoder cells have respective control terminals connected to the first level input signal Code A, second level input signal Code B, and third level input signal Code C.

Suitably, the first sub array 110-0 further includes a first plurality of second level PMOS precharge transistors MPB0 and a first third level PMOS precharge transistor MPC0, while the second sub array 110-1 further includes a second plurality of second level PMOS precharge transistors MPB1 and a second third level PMOS precharge transistor MPC1.

A decoder structure according to embodiments of the present teachings are able to reduce the consumption of area and power of the memory architecture including it. Moreover, the decoder structure according to embodiments is able to reduce unwanted drop in the selection signal and to avoid a spurious enabling signal.

From the foregoing, it will be appreciated that, although specific embodiments of the present teachings have been described herein for purposes of illustration, various modifications may be made without deviating from the spirit and scope of the present teachings. Accordingly, the present teachings are not limited except as by the appended claims.

What is claimed is:

1. A decoder structure comprising:
   first sub column groups including a plurality of first level decoding cells in a first row, wherein the plurality of first level decoding cells commonly receive first level input signals;
   second sub column groups including a plurality of second level decoding cells in a second row which is arranged next to the first row, wherein the plurality of second level decoding cells commonly receive second level input signals;
   third sub column groups including a plurality of third level decoding cells in a third row which is arranged next to the second row, wherein the plurality of third level decoding cells commonly receive third level input signals; and
   a precharge circuit configured to include a first precharge transistor providing a high reference voltage to the first sub column groups,
   wherein a number of the first sub column groups is equal to a number of the plurality of second level decoding cells,
   wherein a number of the second sub column groups is equal to a number of the plurality of third level decoding cells,
   wherein the first sub column groups include second precharge transistors coupled in series to the plurality of second level decoding cells, respectively, and
   wherein the second sub column groups include third precharge transistors coupled in series to the plurality of third level decoding cells, respectively.

2. The decoder structure of claim 1, wherein the second precharge transistors receive the second level input signals, respectively.

3. The decoder structure of claim 1, wherein the third precharge transistors receive the third level input signals, respectively.

4. The decoder structure of claim 1, wherein the plurality of first level decoding cells are NMOS transistors.

5. The decoder structure of claim 1, wherein the plurality of second level decoding cells are NMOS transistors.

6. The decoder structure of claim 1, wherein the plurality of third level decoding cells are NMOS transistors.

7. The decoder structure of claim 1, wherein the first precharge transistor is a PMOS transistor.

8. The decoder structure of claim 1, wherein the second precharge transistors are PMOS transistors.

9. The decoder structure of claim 1, wherein the third precharge transistors are PMOS transistors.

10. The decoder structure of claim 1,
   wherein the precharge circuit further includes an inverting gate providing an enabling signal, and
   wherein the first precharge transistor is disposed between the high reference voltage and the first sub column groups.

11. The decoder structure of claim 10,
   wherein the first precharge transistor includes a control terminal configured to receive a power supply reference voltage, is connected to an input of the inverting gate and provides a selection signal to the input of the inverting gate.

\* \* \* \* \*